(12) United States Patent
Farnworth et al.

(10) Patent No.: US 6,180,527 B1
(45) Date of Patent: Jan. 30, 2001

(54) METHOD AND APPARATUS FOR THINNING ARTICLE, AND ARTICLE

(75) Inventors: Warren M. Farnworth, Nampa; Derek J. Gochnour, Boise, both of ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/374,128

(22) Filed: Aug. 9, 1999

(51) Int. Cl.$^7$ .................................................. H01L 21/302
(52) U.S. Cl. .......................... 438/693; 438/689; 438/690; 438/691; 438/692
(58) Field of Search ............................... 438/693, 691, 438/689, 690, 692

(56) References Cited

U.S. PATENT DOCUMENTS

| | | | |
|---|---|---|---|
| 5,223,734 | 6/1993 | Lowrey et al. ...................... 257/401 |
| 5,324,687 | * 6/1994 | Wojnarowski ...................... 437/225 |
| 5,476,566 | * 12/1995 | Cavasin ................................. 156/249 |
| 5,656,552 | * 8/1997 | Hudak et al. ........................... 438/15 |
| 5,682,065 | 10/1997 | Farnworth et al. .................... 257/727 |
| 5,714,395 | * 2/1998 | Bruel ....................................... 437/24 |
| 5,782,975 | 7/1998 | Linn ......................................... 117/89 |
| 5,801,452 | 9/1998 | Farnworth et al. .................... 257/797 |
| 5,830,806 | * 11/1996 | Hudson et al. ....................... 438/690 |
| 5,841,197 | * 9/1996 | Adamic, Jr. ........................... 257/777 |
| 5,851,845 | 12/1998 | Wood et al. ............................ 438/15 |
| 5,855,735 | * 11/1995 | Takada et al. ..................... 156/636.1 |
| 5,865,666 | * 8/1997 | Nagahara ............................... 451/10 |
| 5,882,990 | * 1/1998 | DeBusk et al. ...................... 438/476 |
| 5,895,972 | 4/1999 | Paniccia .............................. 257/706 |
| 6,004,653 | * 12/1999 | Lee ....................................... 428/141 |
| 6,013,534 | * 1/2000 | Mountain ............................... 438/15 |
| 6,069,366 | * 3/1998 | Goruganthu et al. ............ 250/559.27 |

\* cited by examiner

*Primary Examiner*—Matthew Smith
*Assistant Examiner*—Granvill Lee
(74) *Attorney, Agent, or Firm*—Dickstein Shapiro Morin & Oshinsky LLP

(57) ABSTRACT

A method for thinning articles, such as wafers in an IC product, includes applying a reference layer to a first surface of the article to be thinned; removing a portion of the reference layer from its exposed surface to provide a reference surface; and thinning the article by removing a portion of the article from its second surface to provide a thinned surface. The orientation of the reference surface relative to the second surface is controlled, and the orientation of the thinned surface relative to the reference surface is controlled. There are also provided apparatuses and systems which are suitable for use in such methods, as well as intermediate articles and finished products containing articles formed in such methods.

48 Claims, 6 Drawing Sheets

METHOD AND APPARATUS FOR THINNING ARTICLE, AND ARTICLE

FIELD OF THE INVENTION

This invention relates to articles and methods of thinning articles, in particular, integrated circuit wafers, as well as apparatuses and systems suitable for carrying out such methods.

BACKGROUND OF THE INVENTION

In many known methods for manufacturing semiconductor chips, a relatively large wafer, for example, of silicon is used as a starting material. Such wafers can be obtained by slicing a crystal ingot to a suitable thickness to obtain a number of nearly disk-shaped semiconductor wafers. Typically, both surfaces of each wafer are subjected to abrasive machining, followed by etching in a suitable mixed acid solution, after which one surface of each wafer is polished to obtain a mirror surface. Circuits are applied to the mirror surface of the resulting semiconductor wafer by known processing steps of printing, etching, diffusion, doping, etc.

In the methods described above, the silicon wafers are sliced from the crystal ingot to a thickness that is greater than desirable for a finished integrated circuit product so as to provide a more robust wafer to stand up to the rigors of the integrated circuit fabrication processes. Particularly, relatively thick silicon wafers are necessary during the integrated circuit fabrication steps to prevent warpage and breakage of the wafer as a result of certain heating, handling and other circuit fabrication processes. After the integrated circuits have been fabricated, it is desirable to reduce the thickness of the wafer in order to reduce the overall size and mass of the finished product.

U.S. Pat. No. 5,223,734 discloses a gettering process for semiconductor manufacturing. The gettering process is performed after device formation and after a protective layer such as borophosphorus silicate glass (BPSG) or phosphorous silicate glass (PSG) has been applied to the front side of a semiconductor wafer. The gettering process includes thinning and roughening a backside of the wafer using chemical mechanical planarization (CMP), depositing and diffusing a gettering agent such as phosphorus into the backside of the wafer. The wafer can then be annealed for driving in the gettering agent and segregating mobile contaminants in the wafer at gettering centers formed at the dislocations and at gettering agent sites within the wafer crystal structure. The annealing step may also function to reflow and planarize the BPSG or PSG protective layer. As optional steps, the front side of the wafer may be chemically mechanically planarized (CMP) to planarize the protective, BPSG layer, prior to depositing and diffusing the gettering agent into the backside of the wafer. Additionally, as another optional step, the front side of the wafer may be chemically mechanically planarized (CMP) after the annealing step, if required, to further planarize the protective (BPSG) layer.

U.S. Pat. No. 5,851,845 (Farnworth) discloses a method for packaging a semiconductor die. The package includes a thinned die mounted on a compliant adhesive layer to a substrate. The package is formed by providing a wafer containing a plurality of dice, thinning a backside of the wafer by etching or polishing, attaching the thinned wafer to the substrate, and then dicing the wafer. Either a wet or dry etching process can be used to etch the backside of the wafer.

U.S. Pat. No. 5,895,972 discloses thinning a silicon semiconductor substrate by etching, polishing, milling, etc.

Despite these and other efforts, there remains a need for techniques which enable the manufacture of products with ever-increasing degrees of precision, and with ever-decreasing size, without sacrificing or compromising required properties.

SUMMARY OF THE INVENTION

According to the present invention, there are provided methods, articles and apparatus which, as discussed in more detail below, allow for manufacture of a variety of articles, e.g., IC products, with increased precision, reduced likelihood of damage during manufacture, and further reduction in size and mass.

According to the present invention, a method of thinning an article comprises applying a layer to a first surface of the article. A layer is then formed by removing a portion of the reference layer using a second surface of the article which is opposite to the first reference surface as a plane of reference, to provide a reference surface on the reference surface. Preferably, the reference surface is parallel to the second surface. The article is thinned by removing a portion of the second surface of the article to provide a thinned surface using the reference surface as a plane of reference. By using the reference surface as a plane of reference, the thinned surface is provided with a predetermined specific orientation relative to the reference surface, preferably a parallel orientation.

After thinning, the reference layer can be removed, if desired. Therefore, in one aspect of the invention, the reference layer can be a "sacrificial" layer. In another aspect of the invention, a portion of the reference layer, i.e., some or all of the portion remaining after forming the reference surface, can remain and become part of the finished product.

In accordance with the present invention, the article can be thinned with greater accuracy, because the orientation of the thinned surface is reliably controlled by virtue of the process of the invention, which creates a reference surface having a predetermined orientation relative to the second surface, which reference surface is preserved and used as a reference when thinning the article to produce the thinned surface.

The article can be a single layer, e.g., a silicon wafer, prior to device formation thereon, or it can comprise any number of layers, and can optionally include one or more elements, e.g., semiconductor devices, formed in or on any of the layers. In either case, the reference layer is applied to the first surface of the article.

In one aspect of the invention, the reference layer is preferably a polymer which is coated as a liquid onto the first surface of the article, and allowed to cure on its own or with the help of a curing process and/or agent. Alternatively, the reference layer can be applied as a solid layer, and optionally adhered to the article using an adhesive.

In a preferred aspect of the present invention, the article is an assembly made in the course of manufacturing an IC device. For example, one application of the invention is the thinning of a wafer on which a plurality of semiconductor devices have been formed. In accordance with this preferred aspect of the invention, the article referred to above comprises a wafer having at least first and second surfaces, with the semiconductor devices being formed on the first surface and/or in the wafer, and with the reference layer being applied to the first surface, such that the semiconductor devices are positioned between the wafer and the reference layer.

These and other features and advantages of the invention will become more readily apparent from the following detailed description of preferred embodiments of the present invention which is provided in conjunction with the accompanying drawings. The invention is not limited to the exemplary embodiments described below and it should be recognized that the invention includes all modifications falling within the scope of the attached claims.

DETAILED DESCRIPTION OF PREFERRED EMBODIMENTS OF THE INVENTION

Figure 1A:
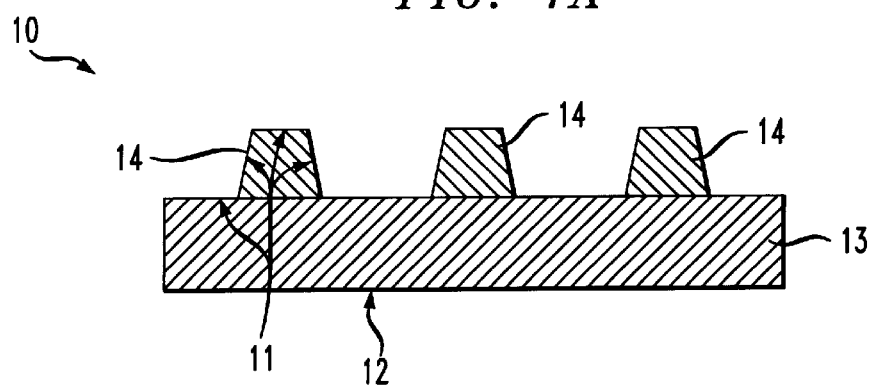
FIGS. 1A–1E are schematic cross-sectional drawings showing an article in various stages of production according to a first preferred method of the present invention.

According to the present invention, there is provided a method of thinning an article which comprises at least one layer and at least first and second surfaces. According to this method, a reference layer is applied to the first surface of the article, the reference layer having an exposed surface and a contact surface which is in contact with the first surface of the article. Then, a portion of the reference layer is removed from the exposed surface to provide a reference surface having a predetermined specific orientation relative to the second surface of the article. Then, the article is thinned by removing a portion of the article from the second surface of the article to provide a thinned surface, the thinned surface having a specific predetermined orientation relative to the reference surface. In a preferred aspect of the invention, the orientation of the thinned surface relative to the reference surface is the same as the orientation of the second surface of the article relative to the reference surface. In a preferred aspect of the invention, the reference surface is formed parallel to the second surface of the article, and the thinned surface is in turn formed parallel to the reference surface. Optionally, the reference layer can subsequently be removed, if desired.

In the present description and claims, the expression "surface" is used in accordance with its well-known meaning, to refer broadly to any substantially planar continuous or discontinuous topographical region of an article, i.e., a region of relatively high topography and/or low topography. For example, the expression "surface" encompasses the two opposites sides of a substantially flat layer in a semiconductor device, regardless of any elements which are positioned so as to be in contact with and covering part of the sides. For example, as discussed below, a preferred aspect of the present invention relates to a process which comprises forming a plurality of separate semiconductor devices on a substantially planar region of a substrate, and then applying a reference layer over the substrate and over the semiconductor devices. If the substrate and semiconductor devices are referred to as the "article", the reference layer is described as being applied to a "surface" of the "article"; the reference layer is also described as being applied to the "surface" of the substrate. In addition, those of skill in the art can readily envision application of the present invention to devices which include elements having more than two planar topographical regions, and to devices which include elements having large numbers of planar topographical regions. In addition, the present invention is not limited to only articles having two sides which are parallel to one another.

The term "layer" is used herein either to refer to individual elements which are or have been brought into contact with one another, e.g., to form a laminate, or to refer to a region of an article which is distinguishable from neighboring regions with regard to at least one property, e.g., its composition.

The expression "removing a portion of an article from a second surface of an article" (and the like) is used in accordance with well-known usage to mean that material is removed from the article from locations adjacent or beneath the second surface of the article, so that the exposed portion of the second surface is removed first, and then removal can continue farther into the article. In other words, such an expression is not limited to removal of only the material at the surface of the article or layer.

The expression "orientation" is used herein to refer to the angular orientation of one surface relative to that of a reference surface. For example, a surface which lies in a plane which is parallel to the reference surface has, by definition, the same orientation as that of the reference surface; two orientations are perpendicular to any given orientation. In addition, any other orientation can be defined in terms of x, y and z coordinates or angular coordinates, as those of skill in the art can readily understand.

The expression "spatial relationship" is used herein to refer to the position and orientation of one surface relative to those of another surface. Therefore any specific spatial relationship can be defined in terms of the orientation in addition to a translation defined in x, y and z coordinates. The x, y and z coordinates can be used to define the distance and direction in which one surface would have to be moved, in addition to any specified change in orientation, to occupy the space occupied by the other surface.

Referring now to the drawings, FIGS. 1A–1E are schematic cross-sectional drawings showing an article in various stages of production according to a preferred method of thinning an article in accordance with the present invention. In accordance with this embodiment, there is provided an article 10 (see FIG. 1A) comprising a wafer 13 having a plurality of features 14 positioned thereon. The article 10 has a first surface 11 and a second surface 12. In view of the above definition of the term "surface", the first surface 11 includes the exposed portion of the upper surface of the wafer 13 as well as exposed surfaces of the features 14.

Figure 1B:
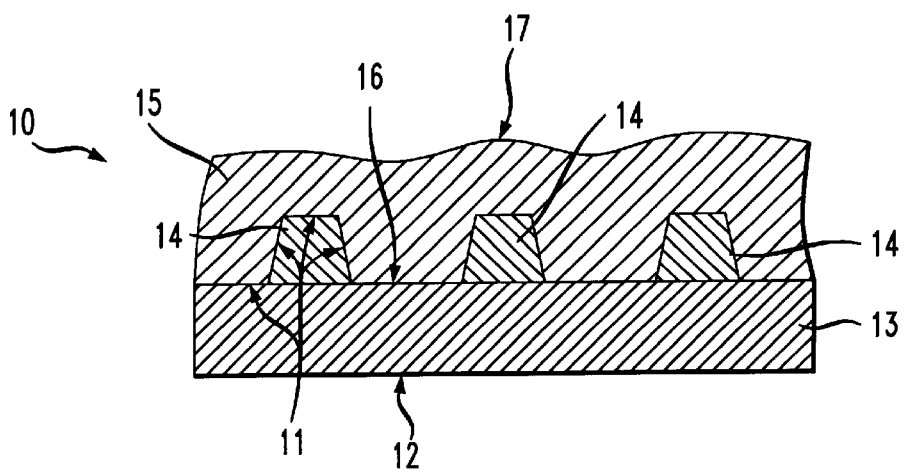
Figure 1C:
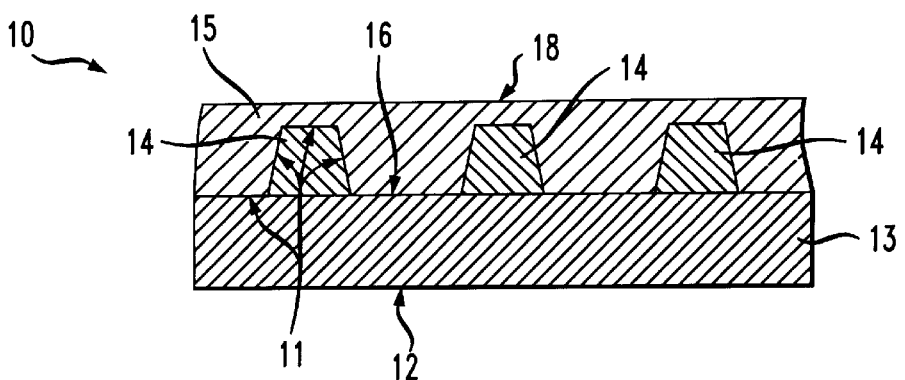

A reference layer 15 is applied to the first surface 11 of the article, thereby producing a structure as shown in FIG. 1B, including a reference layer 15 having a contact surface 16 and an exposed surface 17, wherein the contact surface 16 is in contact with the first surface 11. Then, a portion of the reference layer 15 is removed from the exposed surface 17 of the reference layer 15 to provide a flat reference surface 18 (see FIG. 1C). In this embodiment, the removal from the exposed surface 17 is conducted such that reference surface 18 has a predetermined specific orientation relative to the second surface 12 of the article, namely, the orientation is parallel. Removal from the exposed surface 17 of the reference layer 15 can be carried out by any removal technique known to those skilled in the art, as discussed below, e.g., chemical-mechanical planarization or polishing, described in detail below.

Figure 1D:
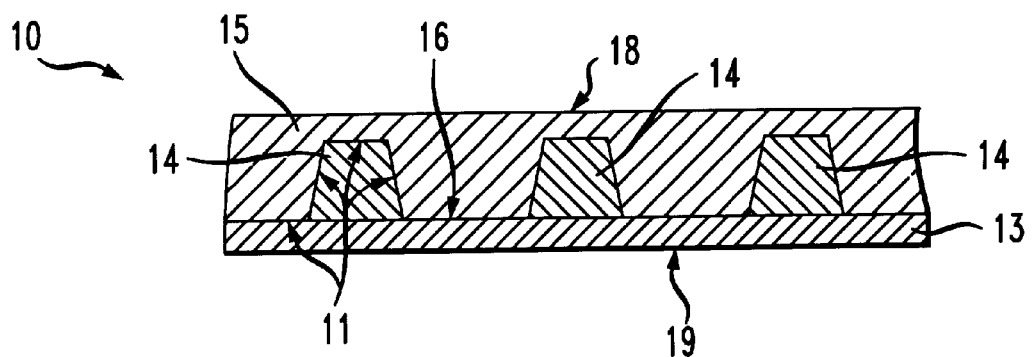
Figure 1E:
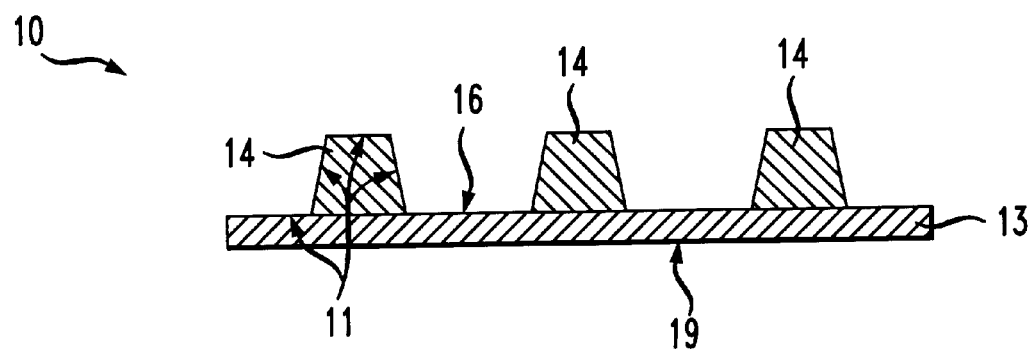

Next, a portion of the wafer 13 is removed from the second surface 12 to provide a thinned surface 19 as shown in FIG. 1D. This removal is conducted such that the thinned surface 19 has a predetermined specific orientation relative to the reference surface 18, this orientation preferably being the same as the orientation that the second surface 12 had relative to the reference surface 18. Removal from the second surface 12 of the article 10 can be carried out by any removal technique known to those skilled in the art, as discussed below, e.g., chemical-mechanical planarization or polishing, described in detail below. In this preferred embodiment, as shown in FIG. 1D, the orientation of the thinned surface 19 relative to the reference surface 18 is parallel. Optionally, the reference layer 15 can subsequently be removed, to provide a structure as shown in FIG. 1E.

In accordance with the method depicted in FIGS. 1A–1E, the provision of a reference layer 15 enables the thinning of the article to be carried out with high precision. For example, the reference layer 15 provides a flat reference surface which has a known orientation relative to the desired thinned surface, whereby the orientation and position of the thinned surface can be closely controlled, and the thinned surface can have enhanced flatness in comparison with prior art methods, which do not provide a reference layer 15. In addition, the provision of a reference layer in accordance with the present invention makes it possible to reduce the size and mass of finished products, by enabling more precise thinning of the article to smaller thicknesses.

Figure 2A:
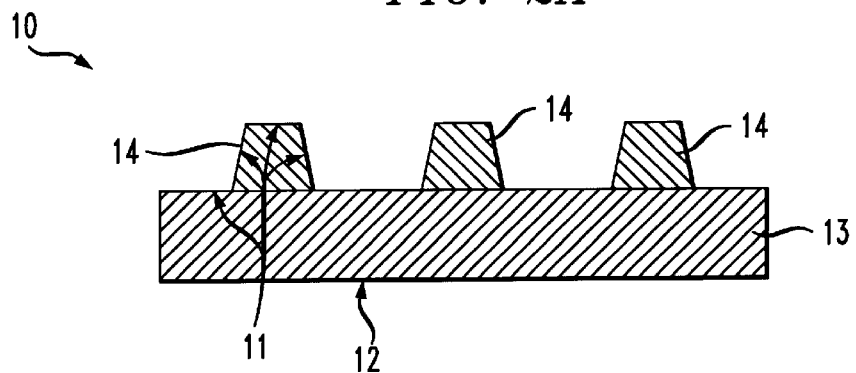
FIGS. 2A–2E are schematic cross-sectional drawings showing an article in various stages of production according to a second preferred method of the present invention.
Figure 2B:
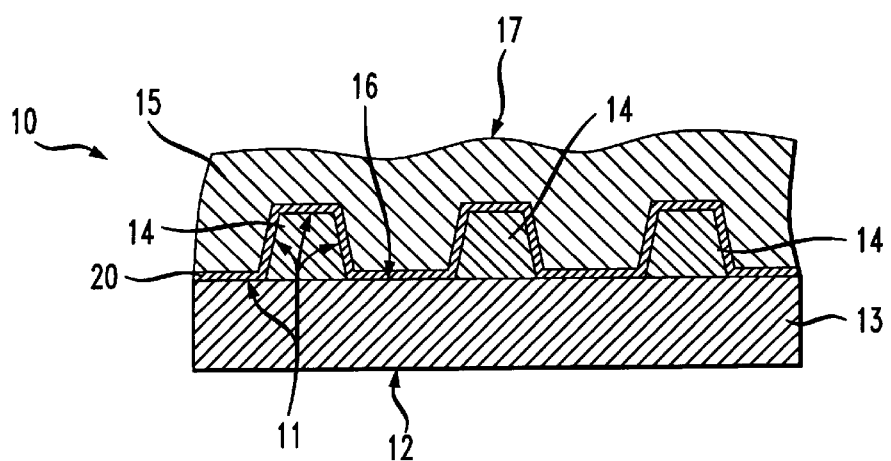
Figure 2C:
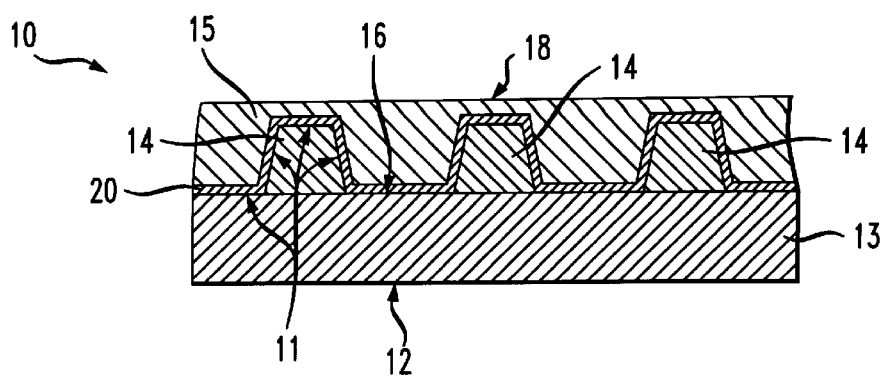

FIGS. 2A–2E are schematic cross-sectional drawings showing an article in various stages of production according to a second preferred method of thinning an article in accordance with the present invention. In accordance with this embodiment, there is provided an article 10 having a first surface 11 and a second surface 12. As in the first embodiment, the article 10 comprises a wafer 13 having a plurality of features 14 positioned thereon. An adhesive layer 20 and a reference layer 15 are applied to the first surface 11 of the article, thereby producing a structure as shown in FIG. 2B. Then, a portion of the reference layer 15 is removed from the exposed surface 17 of the reference layer 15 to provide a reference surface 18 as shown in FIG. 2C, the removal from the exposed surface 17 being conducted such that reference surface 18 has a predetermined specific orientation relative to the second surface 12 of the article. Removal from the exposed surface 17 of the reference layer 15 can be carried out by any removal technique known to those skilled in the art, as discussed below, e.g., chemical-mechanical planarization or polishing, described in detail below. In the embodiment shown in FIG. 2, this orientation is parallel.

Figure 2D:
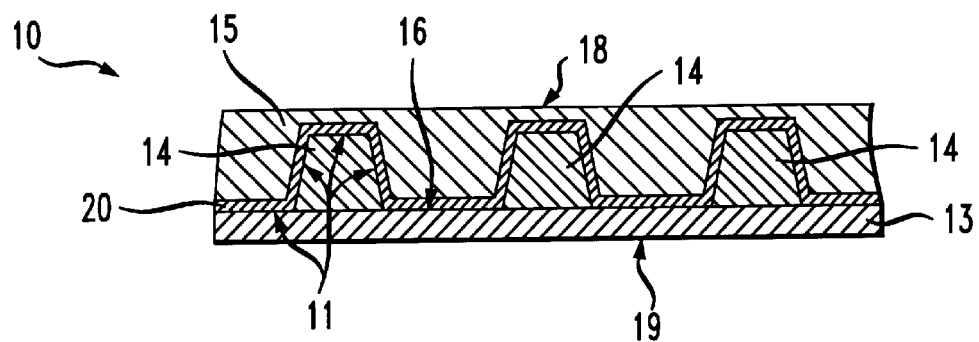

Next, a portion of the wafer 13 is removed from the second surface 12 to provide a thinned surface 19 as shown in FIG. 2D, this removal preferably being conducted such that the thinned surface 19 has the same predetermined specific orientation relative to the reference surface 18 as did the second surface 12 of the article 10. Removal from the second surface 12 of the article 10 can be carried out by any removal technique known to those skilled in the art, as discussed below, e.g., chemical-mechanical planarization or polishing, described in detail below. In this preferred embodiment, as shown in FIG. 2D, the orientation of the thinned surface 19 relative to the reference surface 18 is parallel.

Figure 2E:
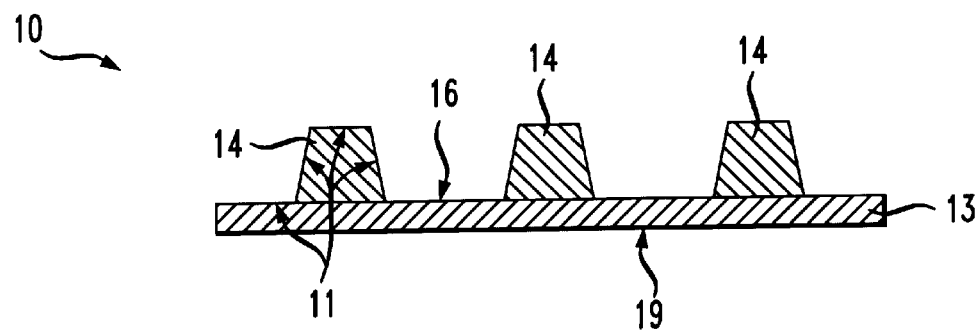

Optionally, the reference layer 15 can subsequently be removed, to provide a structure as shown in FIG. 2E. In a preferred aspect of the invention, the adhesive 20 can be processed so as to reduce its adhesiveness prior to removing the reference layer 15.

In accordance with the method depicted in FIGS. 2A–2E, as with the method depicted in FIGS. 1A–1E, the provision of a reference layer enables the thinning of the article to be carried out with high precision, and makes it possible to reduce the size and mass of finished products, by enabling more precise thinning of the article to smaller thicknesses. In addition, the use of an adhesive 20 to adhere the reference layer 15 to the article 10 can simplify removal of the reference layer, especially where the adhesive is one which can be treated to reduce its adhesiveness.

The present invention can be applied to any article which may need to be thinned, or for which thinning may be desirable. Such articles may consist of a single layer or may comprise two or more layers and/or one or more components or devices of any shape and size. There are a wide range of intermediate articles and processes known in the art which require thinning a layer or for which thinning a layer can provide advantages, and the present invention can be applied to any of these articles or processes, as well as to processes developed in the future for which thinning a layer is required or desired.

The reference layer 15 in accordance with the present invention can be formed of any of a wide range of materials, so long as the properties required of the reference layer 15 are met. These properties include sufficient hardness and resiliency that the reference surface remains substantially flat during subsequent thinning of the article. In addition, the reference layer 15 must be made of a material which can be thinned and/or polished, e.g., by CMP, so as to have a reference surface which is substantially flat and which remains flat during subsequent thinning of the article.

In a preferred aspect of the present invention, the reference layer 15 comprises at least one polymer, and is applied to the first surface 11 of the article 10 as a liquid or a spreadable slurry or spreadable solid. In accordance with this aspect of the invention, the at least one polymer is applied by any of the wide range of suitable techniques known in the art for applying polymer, e.g., coating, spraying, depositing, etc. The polymer is preferably then cured. As used herein, the expression "cure" or "cured" means allowing the material to cure under ambient conditions and/or treating the material in one of the known ways (e.g., by application of elevated temperature, exposure to UV rays, etc.) or with known agents to bring about a change in the nature of the material, e.g., to solidify it. Preferably, curing continues to at least B stage, i.e., a partially cured non-tacky condition that occurs before all of the polymer is completely crosslinked (also known as an intermediate stage where the article is a green product).

An example of a preferred group of polymers for use as the reference layer 15 in accordance with the present invention is epoxy polymers, especially thermoset epoxy polymers. Such polymers are capable of curing at ambient conditions, are relatively inexpensive, and are readily available. Thus, when using thermoset epoxy polymers, curing can be carried out merely through passage of time, or optionally with exposure to UV rays. Another useful property of thermoset epoxy polymers is that, as discussed below, they can be removed by applying solvent which does not attack the typical materials (e.g., silicon, insulators, conductors, etc.) which are commonly used in wafer fabrication. Other suitable polymers include polyimides, polyimidesiloxanes, and generally any other polymer which is capable of providing a suitable reference surface as described herein. Those of skill in the art would readily be able to select suitable polymers based on the properties which are required for the reference layer, including sufficient hardness, resiliency, ability to be thinned or polished, e.g., by CMP, and ability to have and retain substantial planarity while thinning the article. The various steps which can be advantageously employed to cure such polymers are well known to those of skill in the art.

Alternatively, the reference layer 15 may be any other material which is suitable for forming a reference surface 18 which has a predetermined orientation relative to the second surface 12 of the article 10. The reference layer 15 may be applied to the first surface 11 of the article 10 as a liquid layer or a solid layer, and may be applied in any manner known to those of skill in the art, e.g., by coating, spraying, depositing, laminating, etc. The reference layer 15 preferably is self-adhering to the article, or the reference layer 15 can optionally be attached to the first surface 11 by providing an adhesive 20 (see FIGS. 2A–2E) between the reference layer 15 and the first surface 11. The adhesive 20 can be provided by applying it to the contact surface 16 of the reference layer 15, the first surface 11, or both. The adhesive 20 can be applied to the contact surface 16 and/or the first surface 11 in any manner known to those skilled in the art, e.g., by depositing or spin coating. In a preferred aspect of the present invention, the reference layer 15 is a layer of relatively high hardness (the selection of which can be made readily by those of skill in the art so as to be tailored to specific required properties or environments), and the adhesive 20 is a release adhesive, e.g., an adhesive which can be caused to release or substantially release upon heating and/or exposure to UV, or upon any of a variety of other stimuli, such adhesives being well known in the art.

Due to the topography of the first surface 11, the exposed surface 17 of the reference layer 15 may be somewhat wavy or otherwise deviant from substantially planar, as shown in FIGS. 1B and 2B. In accordance with the present invention, a portion of the reference layer 15 is removed from the exposed surface 17 of the reference layer 15 to provide a reference surface 18 on the reference layer 15. The removal of a portion of the reference layer 15 is conducted such that the reference surface 18 has a specific predetermined orientation, preferably parallel, relative to the second surface 12 of the article 10. A discussion of apparatus suitable for achieving such removal and creating a reference surface 18 having a specific predetermined orientation is set forth below.

Removal of a portion of the reference layer 15 can be carried out by any of a variety of methods which are well known in the art. In a preferred aspect of the present invention, such removal is conducted by chemical-mechanical planarization or polishing (CMP), such techniques being well known in the art. The present invention contemplates the use of any suitable CMP method for the removal of a portion of the reference layer 15. CMP processes remove material from a surface of a material, e.g., in the production of ultra-high density integrated circuits. In a typical CMP process, a wafer is pressed against a polishing pad in the presence of a slurry under controlled chemical, pressure, velocity, and temperature conditions. The slurry solution generally contains small, abrasive particles that abrade the surface of the wafer, and chemicals that etch and/or oxidize the surface of the wafer. The polishing pad is generally a planar pad made from a porous material such as blown polyurethane. Thus, when one of the pad and the wafer moves with respect to the other, material is removed from the surface of the wafer by the abrasive particles (mechanical removal) and by the chemicals in the slurry (chemical removal).

CMP techniques have been developed which remove elevated features without significantly thinning the lower areas. CMP processes employ both a chemical and a mechanical component. A rotating or vibrating disk is moved relative to the surface in the presence of a CMP slurry. The slurry includes suspended solids as well as a chemical solution component which attacks the material being polished. The two in combination etch the material being removed by chemical and mechanical action which removes the high points much faster than the low points.

Figure 3:
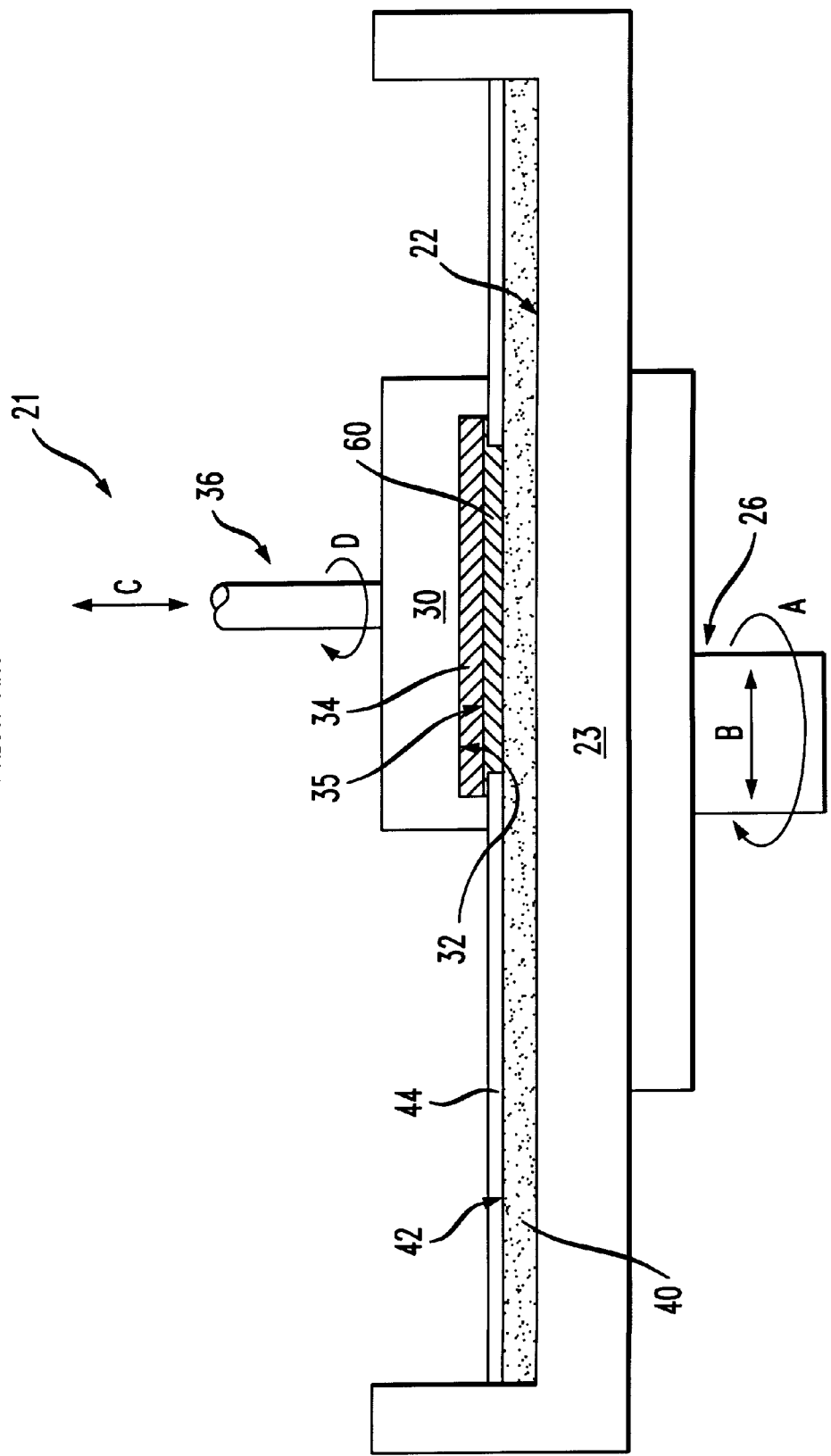
FIG. 3 is a schematic cross-sectional drawing of a CMP device suitable for use in the present invention.

FIG. 3 schematically illustrates a conventional CMP machine 21 with a platen 23, a wafer carrier 30, a polishing pad 40, and a slurry 44 on the polishing pad 40. The platen 23 has a platen surface 22 upon which the polishing pad 40 is positioned. A drive assembly 26 rotates the platen 23 as indicated by arrow "A". In another type of existing CMP machine, the drive assembly 26 reciprocates the platen back and forth as indicated by arrow "B". The motion of the platen 23 is imparted to the polishing pad 40 because the polishing pad 40 frictionally engages the platen surface 22. The wafer carrier 30 has a support surface 32 to which a wafer 60 may be attached, or the wafer 60 may be attached to a resilient pad 34 positioned between the wafer 60 and the support surface 32, the resilient pad 34 having a wafer support surface 35. The wafer carrier 30 may be a weighted, free-floating wafer carrier, or an actuator assembly 36 may be attached to the wafer carrier 30 to impart axial and rotational motion, as indicated by arrows "C" and "D", respectively.

In the operation of the conventional polisher 21, the wafer 60 is positioned face-downward against the polishing pad 40, and then the platen 20 and the wafer carrier 30 move relative to one another. As the face of the wafer 60 moves across the planarizing surface 42 of the polishing pad 40, the polishing pad 40 and the slurry 44 remove material from the wafer 60. In the machine shown in FIG. 3, the orientation of the wafer support surface 35 relative to the polishing pad 40 is parallel. By altering the shape of the resilient pad, this orientation can be altered, as desired. Likewise, the orientation can be altered by changing the shape of the wafer carrier, changing the orientation of the wafer carrier relative to the platen 20, changing the shape of the polishing pad 40, etc.

As discussed above, the removal of a portion of the reference layer 15 is conducted such that the reference surface 18 has a specific predetermined orientation relative to the second surface 12 of the article 10. Such a predetermined orientation can readily be provided in any suitable way, e.g., by holding the article 10 in a holder in a position and at an orientation which are fixed relative to a surface 12 of the article 10 (i.e., the second surface 12), the holder being mounted to a CMP device such that the holder can be moved translationally but not orientationally relative to the CMP device so as to remove material from the reference layer 15 and provide a substantially planar reference surface 18 having a predetermined orientation relative to the second surface 12. In the embodiments shown, this orientation is parallel. In addition, the holder can be mounted such that it is restricted in its movement toward the CMP device, such that the reference surface 18 is parallel to the second surface 12 and is restricted from moving closer than a defined distance from the second surface 12. In such a device, removal of the reference layer 15 can be stopped in response to the reference surface 17 satisfying a defined spatial relationship relative to the second surface 12, e.g., removal or material is stopped when the reference layer has reached a predetermined minimum distance from the second surface 12. For example, in the device shown in FIG. 3, the size and shape of the wafer carrier 30 and the resilient pad 34 (if one is present) can be selected so as to limit movement of the wafer 60 toward the polishing pad 40.

Next, the article 10 is thinned by removing a portion of the article 10 from the second surface 12 to provide a thinned surface 19, the thinned surface 19 having an orientation relative to the reference surface 18 which is preferably the same as the orientation that the second surface 12 had relative to the reference surface 18.

In a preferred aspect of the present invention, a portion of the reference layer 15 is removed in a device which holds the article against a retaining surface, and removes material from the article to create a surface which is parallel to the retaining surface, whereby the reference surface 17 is formed. In this preferred aspect, the article is then inverted and repositioned in the device with the reference surface against the retaining surface, and material is removed from the article to create the thinned surface. The thinned surface is thus provided with an orientation which is parallel to the reference surface, and therefore parallel to the former position of the removed second surface of the article.

The article 10 can be thinned using any of the techniques as described above with regard to removing a portion of the reference layer 15, e.g., by any of the CMP methods known in the art, as discussed above.

The predetermined relative orientation between the thinned surface 19 and the reference surface 18 can readily be provided in any suitable way, e.g., as discussed above in connection with providing a predetermined orientation between the reference surface 18 and the second surface 12. In addition, the spatial relationship between the thinned surface 19 and the reference surface 18 can readily be controlled. For example, the thinning device, e.g., a CMP device as shown in FIG. 3, can be configured such that movement toward the thinning device is limited, whereby thinning of the article is stopped in response to the thinned surface 19 satisfying a predetermined spatial relationship relative to the reference surface 18.

As mentioned above, in one aspect of the invention, after thinning the article to provide the thinned surface 19, the reference layer 15 can be removed. Any suitable technique can be employed to remove the reference layer 15. For example, where the reference layer 15 is made of one or more polymers, it can be etched with any suitable solvent which is known to etch the material out of which the reference layer 15 is formed, but which is known to not attack the underlying article (e.g., substrate and fabrication layers and/or materials). For example, where an epoxy polymer is employed, suitable solvents include acetone, PGMEA (i.e., propyleneglycol-monomethylether-acetate), and any of the other epoxy removal agents well known in the art. In cases where the article includes silicon, e.g., a silicon wafer, such solvents should not include any hydroxyl groups, which etch silicon.

In one preferred aspect of the present invention, as mentioned above, the reference layer 15 is adhered to the article using an adhesive which releases upon exposure to UV, upon heating or upon some other stimuli, and such stimuli is applied to provide or ease removal of the reference layer 15.

Alternatively, depending on the design of the ultimate finished product, the reference layer 15 can be formed such that some or all of the part of the reference layer, e.g., the portion which remains after removal to create the reference surface, is not subsequently removed from the article and is included in the finished product, preferably providing a structural and/or functional property desired in the finished product. For example, the reference layer 15 or a portion thereof can form a passivation layer or a protection layer.

Figure 4A:
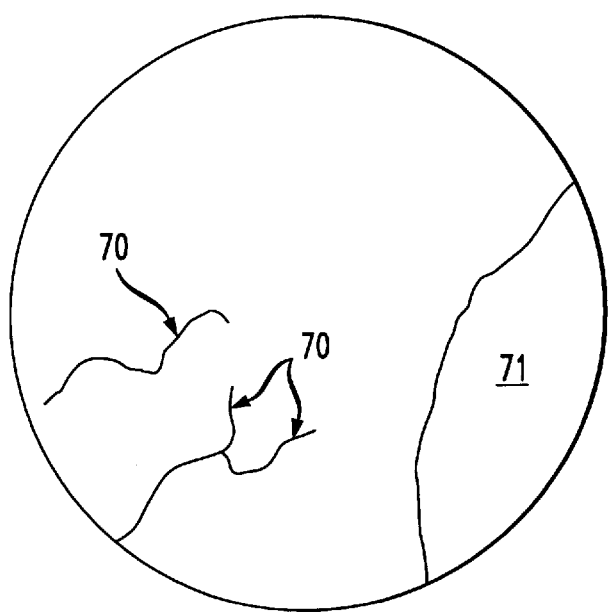
FIG. 4A is a planar view of a surface of a product which has substantial cracking and a substantial area which lacks planarity.
Figure 4B:
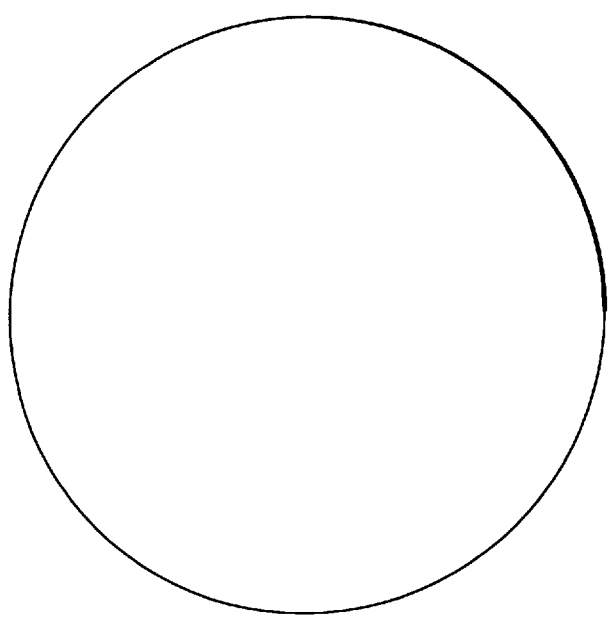
FIG. 4B is a planar view of a surface of a product without substantial cracking and with substantial planarity.

The present invention thus provides products which have greater dimensional precision, and which have reduced size and mass, compared to products obtained by prior art methods. Another advantage of the present invention is that the reference layer 15 (prior to its removal, if it is removed) can be a good source of protection of the first surface 11 of the article and any devices or elements placed within or on the first surface, e.g., article features 14, as discussed above. In addition, the present invention can reduce the incidence of cracking in wafers caused by stress, and can achieve products which have smoother thinned surfaces. FIG. 4A is a flat surface image of a product which has substantial cracking 70 (in the wafer) and significant areas of lack of planarity 71. FIG. 4B is a product of the present invention which does not have substantial cracking (as a result of the protective effects of the reference layer) and is substantially planar.

The present invention is further directed to any sequence of process steps which includes performance of any of the processes in accordance with the present invention, in addition to any other process steps, including but not limited to coating or applying one or more additional layers, removing part of all of one or more additional layers, creating a pattern on a surface of a layer by applying, exposing and developing a photoresists and then removing portions of the layer defined by the pattern, forming interconnect holes through two or more layers, creating interconnects, etc.

Although the articles and methods in accordance with the present invention have been described in connection with preferred embodiments, it will be appreciated by those skilled in the art that modifications not specifically described may be made without departing from the spirit and scope of the invention. Accordingly, the invention is not limited by the foregoing description, but is only limited by the scope of the appended claims.

What is claimed is:

1. A method of thinning an article, comprising:
    applying a reference layer to a first surface of an article to be thinned, such that a contact surface of said reference layer is in contact with said first surface of said article, said reference layer further comprising an exposed surface;
    removing a portion of said reference layer from said exposed surface of said reference layer to provide a reference surface, said reference surface having a predetermined orientation relative to a second surface of said article; and
    thinning said article by removing a portion of said article from said second surface of said article to provide a thinned surface, said thinned surface having a predetermined orientation relative to said reference surface.

2. A method as in claim 1, wherein said predetermined orientation of said reference surface relative to said second surface is substantially the same as said predetermined orientation of said thinned surface relative to said reference surface.

3. A method as in claim 2, wherein said predetermined orientation is parallel.

4. A method as in claim 1, wherein said article comprises two or more layers.

5. A method as in claim 1, wherein said removal of a portion of said reference layer is stopped in response to said reference surface satisfying a defined spatial relationship relative to said second surface of said article.

6. A method as in claim 1, wherein said removal of a portion of said article is stopped in response to said thinned surface satisfying a defined spatial relationship relative to said reference surface.

7. A method as in claim 1, wherein an adhesive is positioned between said reference layer and said first surface of said article, whereby said adhesive adheres said reference layer to said first surface of said article.

8. A method as in claim 1, further comprising removing said reference layer after said article is thinned.

9. A method as in claim 1, wherein said reference layer remains as part of a finished product.

10. A method as in claim 1, further comprising removing part of said reference layer after said article is thinned.

11. A method as in claim 1, wherein said reference layer is self-adhering to said article.

12. A method as in claim 1, wherein said reference layer comprises at least one polymer.

13. A method as in claim 12, wherein said at least one polymer is selected from the group consisting of epoxy polymers, polyimides and polyimide-siloxanes.

14. A method of manufacturing a semiconductor product, comprising:
providing a wafer having at least first and second surfaces;
forming at least one feature within or on said first surface;
applying a reference layer to said first surface, such that said at least one feature is positioned between said wafer and said reference layer, a contact surface of said reference layer being in contact with said at least one feature, said reference layer further comprising an exposed surface;
removing a portion of said reference layer from said exposed surface of said reference layer to provide a reference surface, said reference surface having a predetermined orientation relative to said second surface; and
thinning said article by removing a portion of said wafer from said second surface to provide a thinned surface, said thinned surface having a predetermined orientation relative to said reference surface.

15. A method as in claim 14, wherein said predetermined orientation of said reference surface relative to said second surface is substantially the same as said predetermined orientation of said thinned surface relative to said reference surface.

16. A method as in claim 15, wherein said predetermined orientations are parallel.

17. A method as in claim 14, wherein said removal of a portion of said reference layer is stopped in response to said reference surface satisfying a defined spatial relationship relative to said second surface of said article.

18. A method as in claim 14, wherein said removal of a portion of said wafer is stopped in response to said thinned surface satisfying a defined spatial relationship relative to said reference surface.

19. A method as in claim 14, wherein an adhesive is positioned between said reference layer and said first surface of said wafer, and said adhesive adheres said reference layer to said first surface of said wafer.

20. A method as in claim 14, further comprising removing said reference layer after said article is thinned.

21. A method as in claim 14, wherein said reference layer remains as part of a finished product.

22. A method as in claim 14, further comprising removing part of said reference layer after said article is thinned.

23. A method as in claim 14, wherein said reference layer is self-adhering to said article.

24. A method of thinning an article, comprising:
coating a reference layer composition onto a first surface of an article to be thinned;
curing said reference layer composition to form a reference layer, such that a contact surface of said reference layer is in contact with said first surface of said article, said reference layer further comprising an exposed surface;
removing a portion of said reference layer from said exposed surface of said reference layer to provide a reference surface, said reference surface having a predetermined orientation relative to a second surface of said article; and
thinning said article by removing a portion of said article from said second surface of said article to provide a thinned surface, said thinned surface having a predetermined orientation relative to said reference surface.

25. A method as in claim 24, wherein said reference layer comprises at least one polymer.

26. A method as in claim 25, wherein said at least one polymer is selected from the group consisting of epoxy polymers, polyimides and polyimide-siloxanes.

27. A method as in claim 26, wherein said reference layer comprises at least one thermoset epoxy polymer.

28. A method as in claim 25, further comprising etching said reference layer by contacting said reference layer with a solvent.

29. A method as in claim 24, wherein said predetermined orientation of said reference surface relative to said second surface is substantially the same as said predetermined orientation of said thinned surface relative to said reference surface.

30. A method as in claim 29, wherein said predetermined orientation is parallel.

31. A method of manufacturing a semiconductor product, comprising:
providing a wafer having at least first and second surfaces;
forming at least one feature within or on said first surface;
coating a reference layer composition onto said at least one feature;
curing said reference layer composition to form a reference layer, such that said at least one feature is positioned between said wafer and said reference layer, said reference layer further comprising an exposed surface;
removing a portion of said reference layer from said exposed surface of said reference layer to provide a reference surface, said reference surface having a predetermined orientation relative to said second surface of said wafer; and
thinning said wafer by removing a portion of said wafer from said second surface of said wafer to provide a thinned surface, said thinned surface having a predetermined orientation relative to said reference surface.

32. A method as in claim 31, wherein said reference layer comprises at least one polymer.

33. A method as in claim 32, further comprising etching said reference layer by contacting said reference layer with a solvent.

34. A method as in claim 32, wherein said at least one polymer is selected from the group consisting of epoxy polymers, polyimides and polyimide-siloxanes.

35. A method as in claim 34, wherein said reference layer comprises at least one thermoset epoxy polymer.

36. A method of thinning an article, comprising:

adhering a reference layer to a first surface of an article to be thinned with an adhesive provided between a contact surface of said reference layer and said first surface of said article;

removing a portion of said reference layer from an exposed surface of said reference layer to provide a reference surface, said reference surface having a predetermined orientation relative to a second surface of said article; and thinning said article by removing a portion of said article from said second surface of said article to provide a thinned surface, said thinned surface having a predetermined orientation relative to said reference surface.

37. A method as in claim 36, further comprising processing said adhesive to reduce the adhesiveness of said adhesive, and then removing said reference layer from said article.

38. A method as in claim 37, wherein said processing comprises heating said adhesive.

39. A method as in claim 37, wherein said processing comprises exposing said adhesive to UV rays.

40. An article comprising:

a wafer having at least first and second surfaces;

at least one feature formed within or on said first surface;

a reference layer in contact with said at least one feature, such that said at least one feature is positioned between said wafer and said reference layer, a contact surface of said reference layer being in contact with said at least one feature, said reference layer further comprising an exposed surface;

said exposed surface of said reference layer being substantially parallel to said second surface of said wafer.

41. An article as in claim 40, wherein said reference layer comprises at least one polymer.

42. An article as in claim 41, wherein said at least one polymer is selected from the group consisting of epoxy polymers, polyimides and polyimide-siloxanes.

43. An article as in claim 40, wherein said wafer comprises two or more layers.

44. An article comprising:

a wafer having at least a first surface and a second surface;

at least one feature formed within or on said first surface;

a reference layer having a contact surface and an exposed surface, said exposed surface of said reference layer being substantially parallel to said second surface of said wafer;

an adhesive layer, said adhesive layer adhering said contact surface of said reference layer to said at least one feature and/or said first surface of said wafer.

45. An article as in claim 44, wherein said wafer comprises two or more layers.

46. An integrated circuit comprising:

a wafer having at least first and second surfaces;

at least one feature formed within or on said first surface;

a reference layer in contact with said at least one feature, such that said at least one feature is positioned between said wafer and said reference layer, a contact surface of said reference layer being in contact with said at least one feature, said reference layer further comprising an exposed surface;

said exposed surface of said reference layer being substantially parallel to said second surface of said wafer.

47. An integrated circuit as in claim 46, wherein said reference layer comprises at least one polymer.

48. An integrated circuit comprising:

a wafer having at least a first surface and a second surface;

at least one feature formed within or on said first surface;

a reference layer having a contact surface and an exposed surface, said exposed surface of said reference layer being substantially parallel to said second surface of said wafer; and an adhesive layer, said adhesive layer adhering said contact surface of said reference layer to said at least one feature and/or said first surface of said wafer.

* * * * *

UNITED STATES PATENT AND TRADEMARK OFFICE
CERTIFICATE OF CORRECTION

PATENT NO.    : 6,180,527 B1
DATED         : January 30, 2001
INVENTOR(S)   : Warren M. Farnworth et al.

It is certified that error appears in the above-identified patent and that said Letters Patent is hereby corrected as shown below:

Column 9,
Line 57, change "adhesive which" to -- adhesive 20 which --.

Signed and Sealed this

Twenty-fifth Day of September, 2001

*Attest:*

*Attesting Officer*

NICHOLAS P. GODICI
*Acting Director of the United States Patent and Trademark Office*